United States Patent [19]

Mitchell et al.

[11] Patent Number: 4,924,355

[45] Date of Patent: May 8, 1990

[54] PERSONAL COMPUTER HAVING EXPANSION CARD ADAPTER BRACKET

[75] Inventors: Charles W. Mitchell, Spring; Robert G. Rodriquez, San Antonio, both of Tex.

[73] Assignee: Dell Corporate Services Corporation, Austin, Tex.

[21] Appl. No.: 343,765

[22] Filed: Apr. 25, 1989

[51] Int. Cl.$^5$ ............................................... H05K 7/14
[52] U.S. Cl. .................................... 361/415; 361/395; 361/413; 361/427; 364/708
[58] Field of Search ................. 174/35 R, 51; 211/41; 361/393, 394, 395, 399, 413, 415, 424, 427, 429; 439/88, 92, 108; 364/708

[56] References Cited

U.S. PATENT DOCUMENTS 4,716,499 12/1987 Bharagava ........................... 361/395
4,745,524 5/1988 Patton, III ........................... 361/395
4,791,524 12/1988 Teigen et al. ........................ 361/399

Primary Examiner—Gregory D. Thompson
Attorney, Agent, or Firm—Thomas G. Devine

[57] ABSTRACT

A personal computer has a chassis having a plurality of expansion slots in which are mounted optional Input-/Output (I/O) expansion cards. At least one first expansion card has a first bracket adapted for connection to a mounting fixture. At least one second expansion card has a second bracket that is not adapted for connection to the mounting fixture. An adapter bracket is provided which is configured to connect to the mounting fixture and also to the second bracket to provide mounting of the second expansion card in one of the expansion card positions.

4 Claims, 4 Drawing Sheets

PERSONAL COMPUTER HAVING EXPANSION CARD ADAPTER BRACKET

BACKGROUND OF THE INVENTION

1. Field of the Invention

This invention relates to the mounting of Input/Output (I/O) expansion cards in personal computers. More particularly, it relates to the mounting of I/O expansion cards in different types of personal computers.

2. Description of the Prior Art

The I/O expansion cards in the prior art personal computers have brackets for connection to a mounting fixture in the computer chassis. In a later model prior art personal computer, the I/O expansion cards are provided with brackets different from those used in the earlier personal computer. Each chassis was specifically designed to mount either the earlier or the later type of bracket.

Another prior art approach has been to provide various combinations of mounting fixtures within a single chassis. The problem with this approach is that of predicting what the user will want.

This invention provides for mounting of either type of bracket in a common chassis.

BRIEF SUMMARY OF THE INVENTION

This invention involves interchangeability of I/O expansion cards between a first and a second type of personal computer. The first type of personal computer has a mounting fixture for mounting I/O expansion cards wherein each expansion card is provided with a bracket adapted to be connected to the mounting fixture. Likewise, the second type of personal computer has a mounting fixture and I/O expansion cards, each having a bracket adapted for connection to the mounting fixture. The mounting fixtures from the first and second types of personal computers are dimensionally different so that the I/O expansion cards cannot be interchanged. This invention involves an adapter bracket that is designed for mounting the expansion cards of the second type of personal computer to the mounting fixture of the first type of personal computer.

The adapter bracket is configured to connect to the mounting fixture of the first type of personal computer and to receive, in a pressure-fit, the I/O expansion card bracket of the second type of personal computer. The expansion card bracket of the second type of personal computer has a pair of side rails disposed along its length, the side rails each including a number of pressure-fit ground contact points. The adapter bracket has a pair of side flanges disposed along its length. The flanges receive the side rails, in a pressure-fit, thereby providing good ground contact between the pressure-fit ground contact points and the side rails. This pressure-fit reduces stray electromagnetic radiation from the personal computer.

The principal object of this invention is to provide an expansion card adapter bracket for enabling the installation of I/O expansion cards of one type in a personal computer with I/O expansion cards of another type.

This and other objects will be made evident in the detailed description that follows.

DETAILED DESCRIPTION OF THE INVENTION

This invention enables the intermingling of I/O expansion cards from a later (second) type of personal computer with those of an earlier (first) type of personal computer, within the chassis of the earlier type of computer. The two types of I/O expansion cards each have a different bracket for mounting to the mounting fixture on the computer chassis. The manner in which this problem is solved is set out below.

Figure 1:
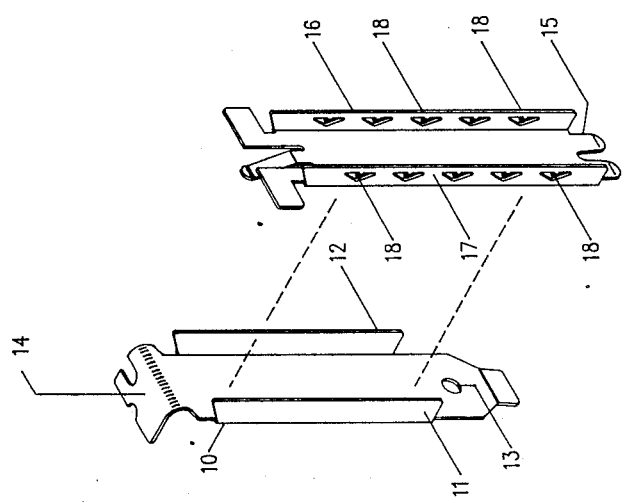
FIG. 1 is a perspective view of the expansion card adapter bracket of this invention together with a perspective view of the second type of I/O expansion card bracket.

FIG. 1 illustrates adapter bracket 10 and bracket 15 in an exploded perspective view. Bracket 15 is that which is used in the later model of personal computer and is connected to I/O expansion card 20 (see FIG. 3). Adapter bracket 10 is shown with side flanges 11 and 12. Threaded hole 13 receives a thumbscrew (not shown) to secure adapter bracket 10 at the lower end and section 14 is used for securing at the upper end.

Bracket 15 is shown with side rails 16 and 17, each of which has a plurality of ground contact points 18 for contacting side flanges 11 and 12 of adapter bracket 10. This grounding is well known in the prior art and is used for reducing electromagnetic radiation by limiting the lengths of slots formed between side rails 16 and 17 and side flanges 12 and 11, respectively.

Figure 2:
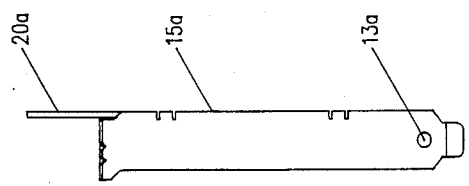
FIG. 2 is a front view of the first type of I/O expansion card bracket.

FIG. 2 is a front view of bracket 15a used with the first type of personal computer. Expansion board 20a is shown connected to bracket 15a. Threaded hole 13a receives a screw (not shown) to secure bracket 15a at the lower end.

Figure 3:
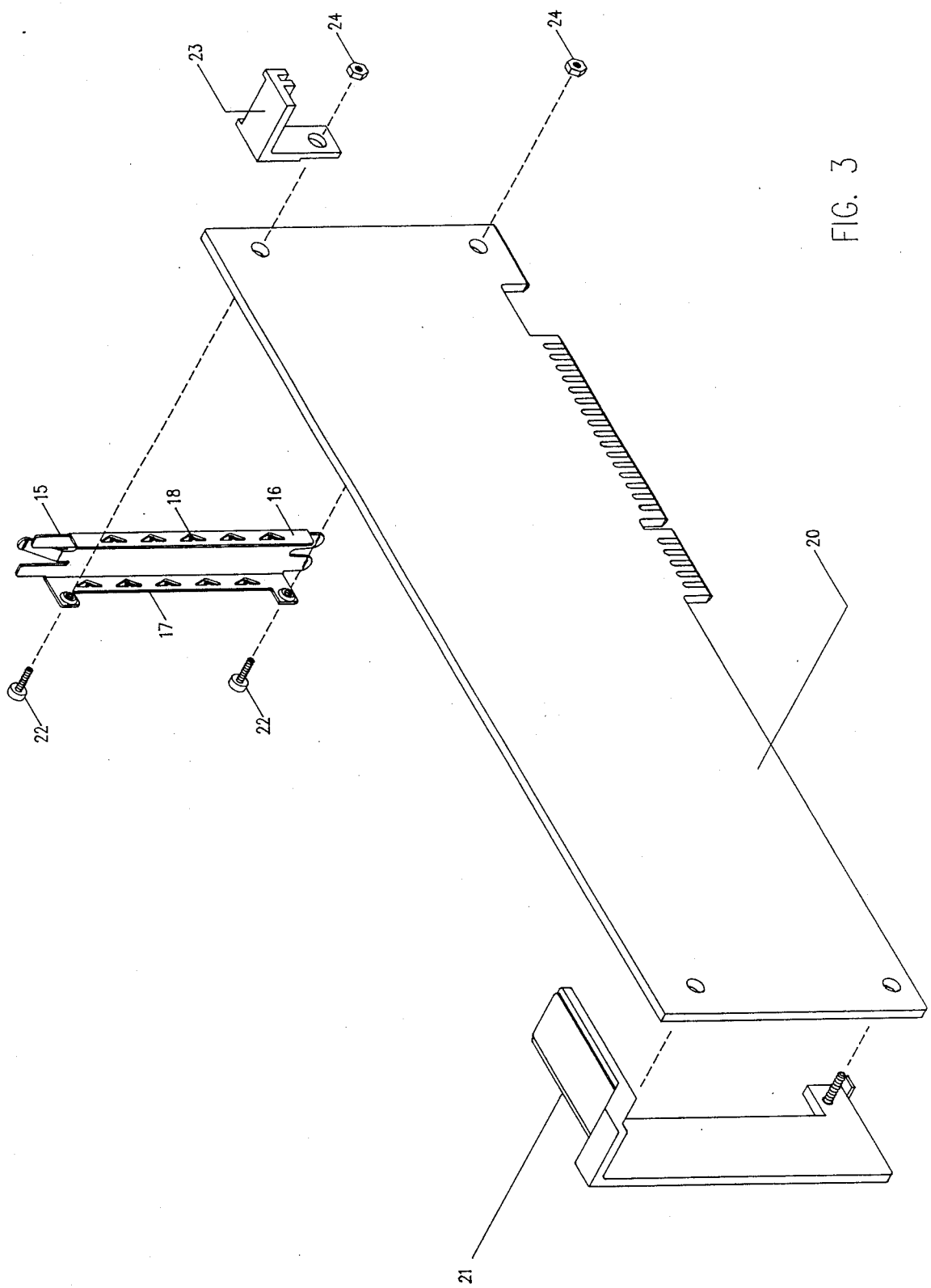
FIG. 3 is a perspective, exploded view of the expansion card of this invention.

FIG. 3 is a perspective drawing illustrating I/O expansion card 20 to which is connected bracket 15. Bracket 15 is shown connected by way of rivets 22 and washers 24. Holder 23 secures the upper end of bracket 15. Retainer 21 is shown at the other end of I/O expansion card 20. Retainer 21 adds length to I/O expansion card 20 to compensate for the fact that later I/O expansion card 20 is shorter than the earlier I/O expansion cards 20a. Retainer 21 fits into a card holder at the other side of the chassis (not shown).

Figure 4A:
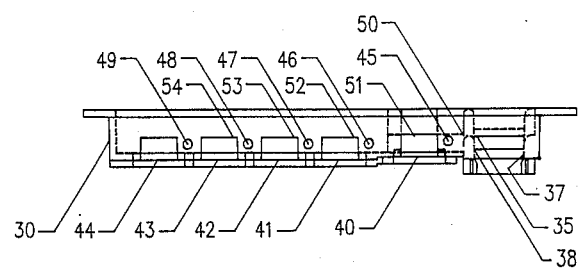
FIG. 4a is a top view of the mounting fixture of this invention.
Figure 4B:
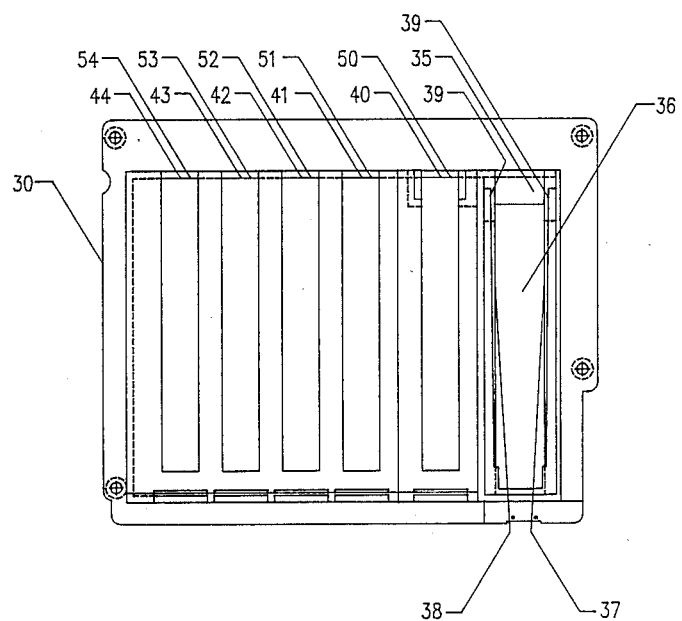
FIG. 4b is a front view of the mounting fixture of this invention.

FIGS. 4a and 4b are a top view and a front view, respectively, of mounting chassis 30 which is attached to the chassis of the personal computer (not shown). Position 36 illustrates an aperture defined by tapered side walls 37 and 38 and mounting studs 39. This is a dedicated mounting fixture for bracket 15 whose side rails 16 and 17 are tapered to fit within tapered walls 37 and 38 and whose upper portion is captured by mounting studs 39 and mounting FIG. 35. Positions 40 through 44 accommodate bracket 15a. If it is desired to install the later model expansion card 20 in one or more of positions 40–44, bracket 15 is inserted into adapter bracket 10 which is then connected in any of the positions 40–44 and secured by a screw 45–49 in the appropriate position formed in mounting fixtures 50-54, respectively.

Figure 5:
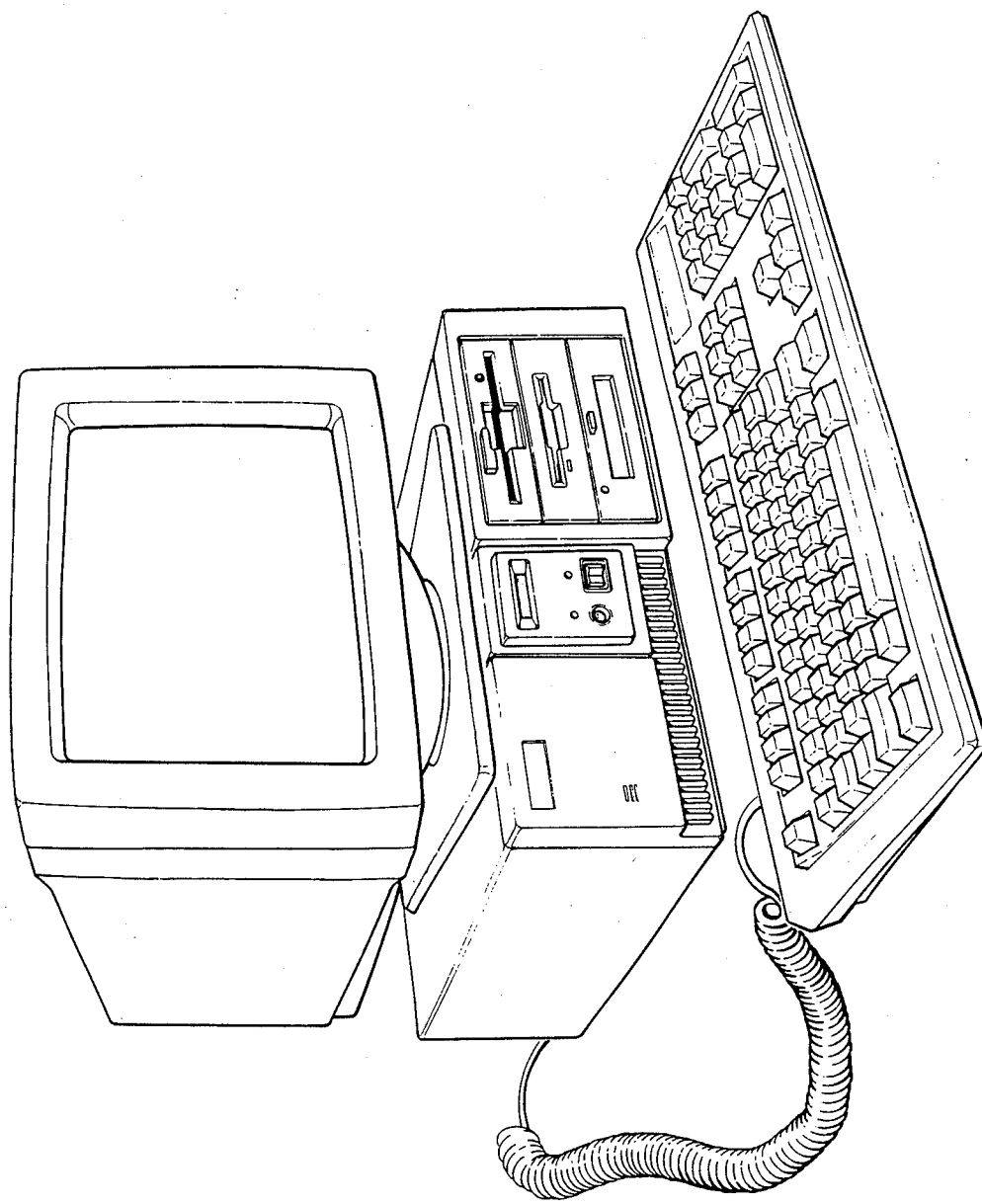
FIG. 5' is a perspective view of the personal computer of this invention.

In this manner, the personal computer 5,5 as shown in FIG. 5, may be configured with any combination of first and second I/O expansion cards.

Those skilled in the art may contemplate reversing adapter bracket 10 with bracket 15, or may provide more or less dedicated positions for the I/O expansion cards, all without departing from the spirit and scope of this invention which is limited only by the appended claims.

What is claimed is:

1. A personal computer comprising;
   (a) a mounting chassis having a plurality of expansion card positions, each position having a mounting fixture;
   (b) at least one first expansion card, mounted in one of the expansion card positions, having a first bracket adapted for connection to a respective mounting fixture;
   (c) at least one second expansion card, mounted in one of the expansion card positions, having a second bracket not adapted for connection to a respective mounting fixture; and
   (d) an adapter bracket, configured to connect to a respective mounting fixture, and also configured to connect to the second bracket, to effect mounting the second expansion card in the one of the expansion card positions.

2. The computer of claim 1 wherein the adapter bracket is configured to receive the second bracket in a pressure fit.

3. The computer of claim 2 wherein the adapter bracket comprises a pair of side flanges disposed along its length.

4. The computer of claim 3 wherein the second bracket comprises a pair of side rails disposed along its length, the side rails each including a plurality of pressure fit ground contact points that contact the side flanges to reduce electromagnetic radiation from the computer.

* * * * *